United States Patent [19]
Hwang et al.

[11] Patent Number: 5,948,532
[45] Date of Patent: Sep. 7, 1999

[54] CERMET ADHESION LAYER WITH CARBONACEOUS WEAR LAYER FOR HEAD/DISK INTERFACES

[75] Inventors: Cherngye Hwang; Vedantham Raman; John Walter Raniseski, all of San Jose, Calif.

[73] Assignee: International Business Machines Corporation, Armonk, N.Y.

[21] Appl. No.: 08/763,265

[22] Filed: Dec. 10, 1996

[51] Int. Cl.[6] .............................. B32B 9/00; G11B 5/187
[52] U.S. Cl. ..................... 428/408; 428/702; 428/692; 360/122
[58] Field of Search .................. 428/64.2, 64.3, 428/64.6, 65.3, 469, 692, 693, 697, 702, 900, 408; 360/122

[56] References Cited

U.S. PATENT DOCUMENTS

| | | | |
|---|---|---|---|
| 4,647,494 | 3/1987 | Meyerson et al. | 428/216 |
| 4,661,409 | 4/1987 | Kieser et al. | 428/408 |
| 4,713,279 | 12/1987 | Fujiwara et al. | 428/142 |
| 5,159,508 | 10/1992 | Grill et al. | 360/103 |
| 5,175,658 | 12/1992 | Chang et al. | 360/103 |
| 5,271,802 | 12/1993 | Chang et al. | 216/22 |
| 5,336,550 | 8/1994 | Ganapathi et al. | 428/216 |
| 5,425,988 | 6/1995 | Ogawa et al. | 428/333 |
| 5,470,447 | 11/1995 | Mahvan et al. | 204/192.16 |
| 5,475,552 | 12/1995 | Nasu et al. | 360/122 |

OTHER PUBLICATIONS

"Interface modifications for improving the adhesion of a–C:H films to metals" by A. Grill J. Mater. Res 3(2) Mar./Apr. 1988.

*Primary Examiner*—Ponnathapura Achutamurthy
*Assistant Examiner*—P. Ponnaluri
*Attorney, Agent, or Firm*—G. Marlin Knight; Michele A. Mobley

[57] ABSTRACT

We disclose a bi-layer wear pad, for use in a slider/magnetic media interface, comprising a wear layer and an adhesion layer. The wear material is either carbon or a carbonaceous material. Typical carbonaceous materials useful for wear layers include elements such as hydrogen, fluorine, nitrogen, boron, and silicon dioxide. The adhesion layer is a thin cermet such as nichrome oxide (NiCrOx) or chromium silicon oxide (CrSiOx). Use of the cermet adhesion layer allows a relatively thick wear layer to be deposited with good adhesion and superior durability.

24 Claims, 5 Drawing Sheets

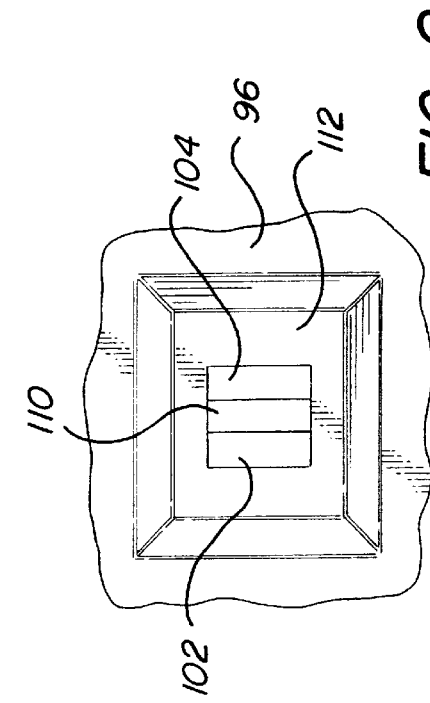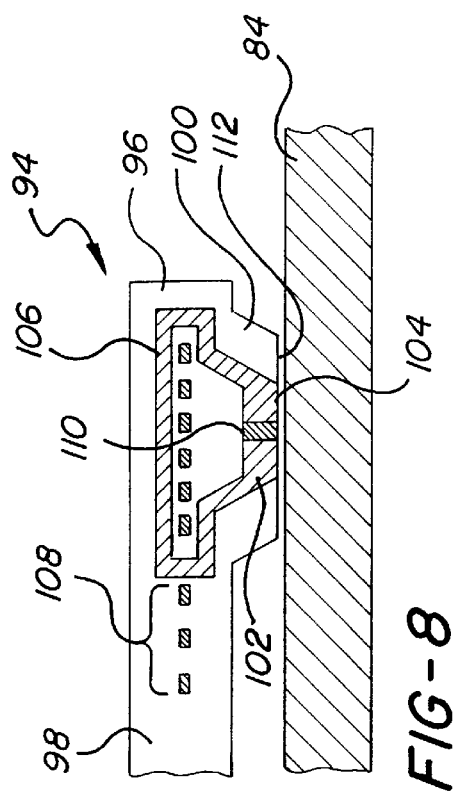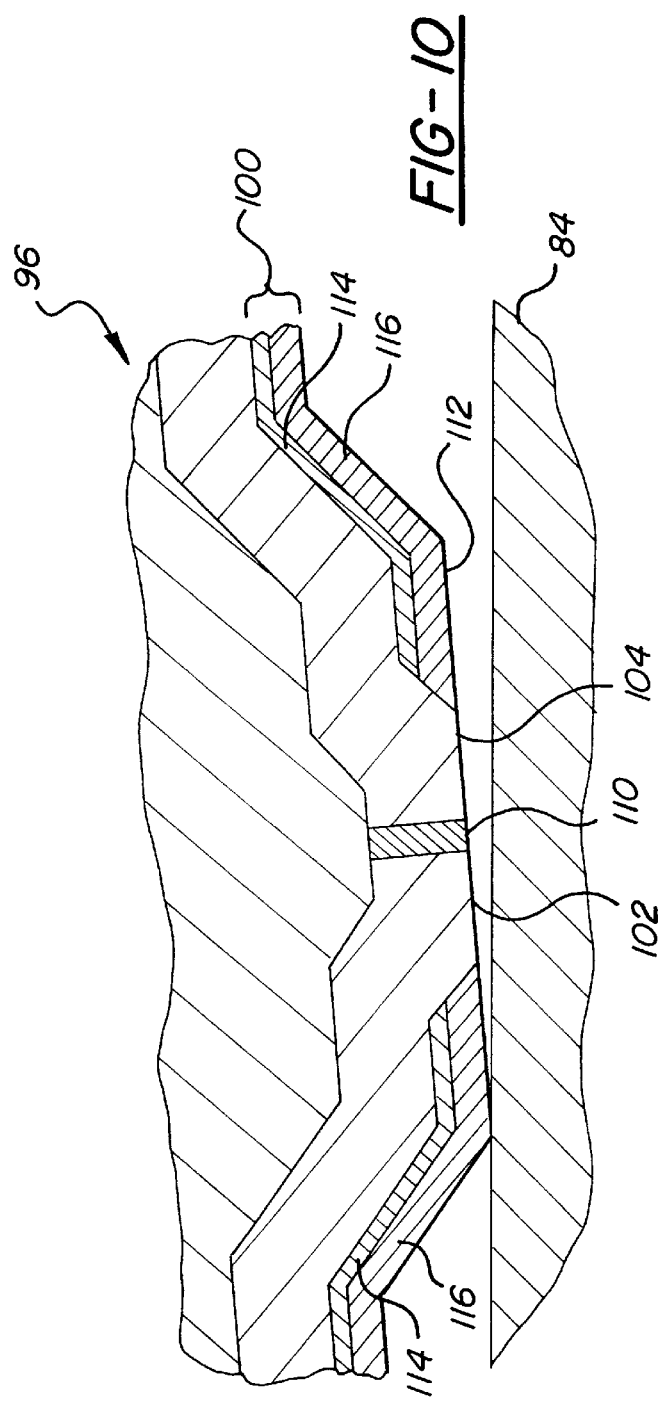

CERMET ADHESION LAYER WITH CARBONACEOUS WEAR LAYER FOR HEAD/DISK INTERFACES

FIELD OF THE INVENTION

The present invention relates to wear resistant materials for use in the head/disk interface of magnetic recording devices. More particularly, the invention pertains to slider and head adhesion layer composition for use under a carbonaceous wear layer.

BACKGROUND OF THE INVENTION

A disk drive or direct access storage device ("DASD") includes one or more disks stacked on a spindle. The surface of each disk is allocated into concentric tracks where data is stored. The disks may be made of a variety of materials. Most commonly, the disks are made of metal, glass or plastic. Storage of data on these disks entails magnetizing portions of the disk in a pattern which reflects the data.

In order to magnetize tiny areas of the surface of a disk, a small ceramic element called a slider which contains a magnetic transducer known as a write head is passed over the surface of the disk. More specifically, when operating at full speed the write head typically is flown at a height of approximately one to two millionths of an inch from the surface of the disk and is flown over the track as the write head is energized to various states causing the track on the disk below to be magnetized to represent the data to be stored. During startup and shutdown processes, when the disk is either not rotating or is rotating too slowly to provide the air bearing, the slider will be in contact with the disk. Shock events can also cause the slider to contact the disk.

To retrieve data stored on a magnetic disk, the slider, which also contains a read head, is flown over the disk. The magnetized portions of the disk induce a current in the read head. By looking at output from the read head, the data can be reconstructed for use by the computer system. Typically, the same ceramic block contains both a read head and a write head.

Like a record, both sides of a disk are generally used to store data or other information necessary for the operation of the disk drive. Since the disks are held in a stack and are spaced apart from one another, both the top and the bottom surface of each disk in the stack of disks has an associated slider.

To meet the ever-increasing density requirements of magnetic data storage devices, such as the disk drives, major emphasis has been placed on reducing the spacing between the head and the disk. The spacing loss is regarded as the most severe limitation in achieving higher density magnetic storage. To minimize the spacing between the head and the disk, the conventional hard disk drive utilizes an air-bearing technique to fly the head very close to the disk. To ultimately eliminate entirely the spacing between head and disk, contact recording for the disk drive has been proposed.

The REED head structure is one contact recording scheme known in the industry. The REED head structure is an integrated transducer/slider/suspension design that replaces the suspension assembly discussed above. Basically, it is a long, thin rod, known as a "reed," made of thick film aluminum oxide ($Al_2O_3$). Within it, there are conductor leads, as well as magnetic transducers (read/write heads). Because it is a lightweight, integrated structure, the REED head can remain in contact with the magnetic disk at all times. The critical component of the REED head structure is the wear lifetime of the contact wear pad(s).

In the first attempt to achieve a wear-resistant head, sputtered aluminum oxide ($Al_2O_3$) was used as a contact wear pad in the REED head structure. However, it has been determined that the wear rate of $Al_2O_3$ is considerably faster than desired. Carbon and various carbonaceous materials have been disclosed for use as the protective layer for magnetic media surfaces, but when deposited to a useful thickness these materials will not adhere properly to substrate materials used for sliders.

SUMMARY OF THE INVENTION

In this application, we disclose a bi-layer wear pad, for use in a slider/magnetic media interface, comprising a wear layer and an adhesion layer. The wear material is either carbon or a carbonaceous material. Typical carbonaceous materials useful for wear layers include elements such as hydrogen, fluorine, nitrogen, boron, and silicon dioxide. The adhesion layer is a thin cermet such as nichrome oxide (NiCrOx) or chromium silicon oxide (CrSiOx). Use of the cermet adhesion layer allows a relatively thick wear layer to be deposited with good adhesion and superior durability. REED head pads made according to the invention have much better wear resistance than the $Al_2O_3$ pads which are known in the art.

Although the preferred embodiment of the invention described below is for use in the REED head structure, use of the invention is not limited to any particular structure. It may be used in any application or design which includes an air-bearing or other surface that has a possibility of being in contact with the media surface and is, therefore, in danger of sustaining significant wear during the lifetime of the disk drive. One example is the front pad in a step slider design. Another example is any landing pad on an air bearing surface that is designed to assist the slider dynamics during takeoff and landing. The invention could also be used in tape drive heads and heads for use with floppy disks.

BRIEF DESCRIPTION OF THE DRAWINGS

FIG. 8 is a side-section view of an integrated head-suspension assembly coated in accordance with the present invention.

FIG. 9 is a view of the bottom, or disk side, of the wear pad of the head carrier depicted in FIG. 8.

FIG. 10 is an enlarged sectional view of the wear pad and pole piece of the head carrier.

DETAILED DESCRIPTION OF THE INVENTION

The embodiment of the invention will be described for an article of manufacture known as a slider on a suspension assembly used in a disk drive. The adhesion layer comprises a ceramic and a metal forming a cermet. The preferred embodiment uses chromium oxide as the ceramic and nickel-chromium (nichrome) as the metal. The preferred composition has wt. 80% ceramic and wt. 20% metal. The metal is wt. 80% nickel and wt. 20% chromium. These ratios were found to give the best results based on the test results, but varying the NiCr from wt. 5% to 50% resulted in useful adhesion materials. Other cermets can also be used as the adhesion layer. For example, wt. 50% Cr and 50% $SiO_2$ was found to provide acceptable adhesion and plus or minus wt. 20% of Cr would be expected to perform properly. Other metals which could be used are tungsten, tantalum, titanium and molybdenum. Another ceramic which could be used is alumina. The cermet and the wear layer can be deposited by sputtering or ion beam deposition. Sputter targets of cermets such as nichrome chromium oxide are commercially available in a wide range of materials and percentages. The creation of the cermet targets is not part of the invention and can accomplished using well known techniques. The wear layer can be carbon or a carbonaceous material. The creation and deposition of the wear layer material is also not part of the invention and can be accomplished using standard well known techniques and materials. Carbon (graphite) sputtering targets are readily available. Typical carbonaceous materials useful for wear layers include elements such as hydrogen, fluorine, nitrogen, boron, and silicon dioxide. According to the various teachings in the prior art, elements in addition to carbon are sometimes introduced in the sputtering chamber (e.g. $H_2$, $CH_4$, $N_2$) and/or can be included in the sputtering targets. The understanding of the application of the invention will be aided by reference to the drawings.

Figure 1:
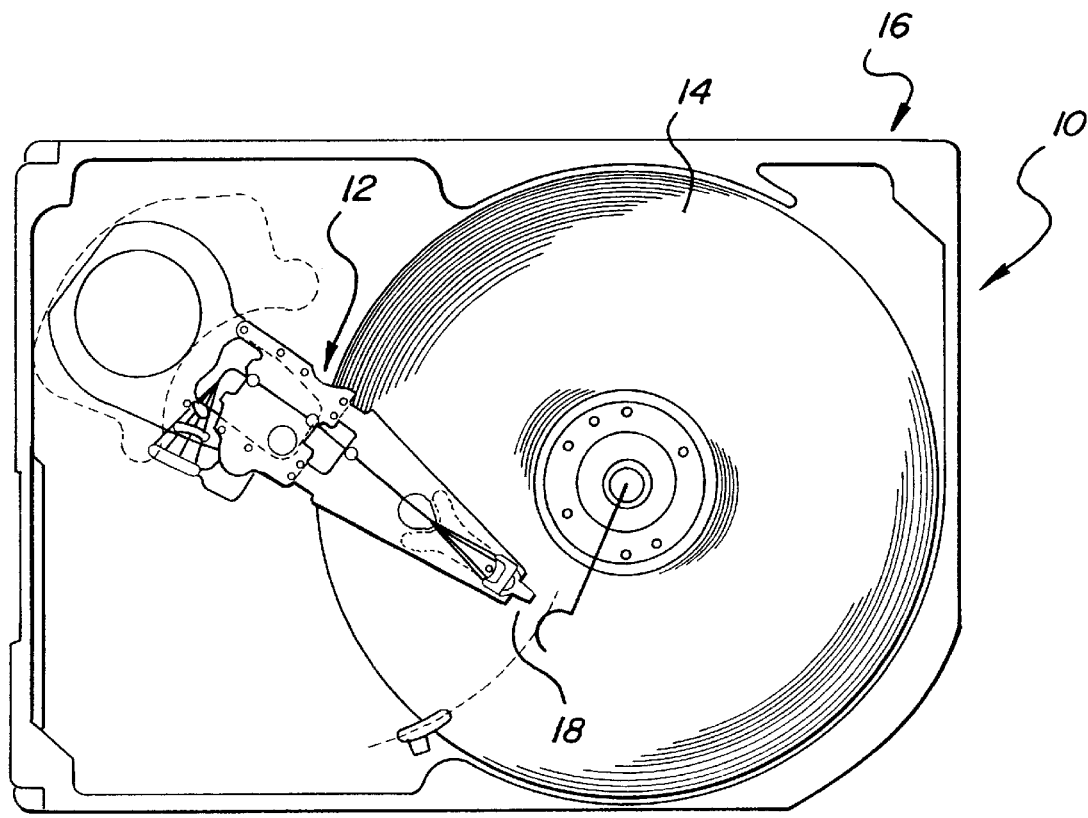
FIG. 1 is a top view diagram of a disk drive.

FIG. 1 is a top view of a typical disk drive 10 showing a suspension assembly 12. Also shown is a disk 14 on which information is stored that needs to be accessed by an information handling system (i.e., computer, not shown). Also shown is the casing 16 surrounding and protecting the disk 14 and the suspension assembly 12. The head 18 is at the end of the suspension assembly 12 and in accordance with the present invention operates in direct contact with the disk 14. Although a rotary suspension assembly is shown, the invention applies to linear suspension assembly drives as well.

Figure 2:
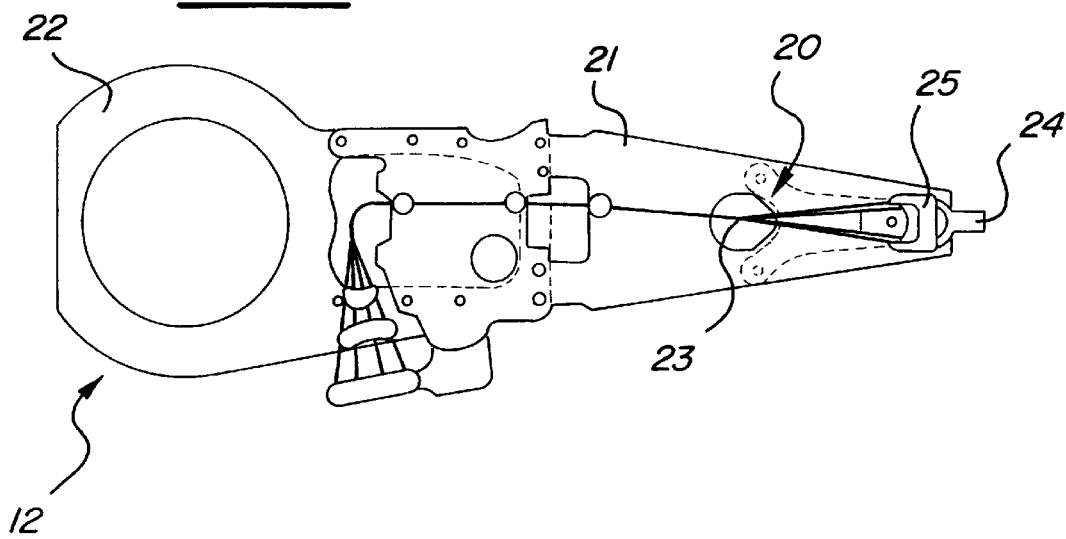
FIG. 2 is a top view diagram of a suspension assembly including a slider designed to operate in direct contact with a disk.

FIG. 2 is a top view diagram of the suspension assembly 12. FIG. 2 shows the overall design of the suspension assembly 12. The suspension assembly 12 consists of a slider 30 (shown in FIG. 3) which is bonded to a flexure 20. The slider 30 rests underneath the flexure 20. The flexure 20 provides the slider 30 with appropriate pitch and roll stiffness which is important in accurately reading and writing information to and from the disk 14. As discussed in the background section, the read or write head attached to the slider 30 is used to read or write information from or to the disk 14 in a disk drive 10. The flexure 20 is welded onto a load beam 21. The load beam 21 provides the appropriate vertical load for optimal operation of the suspension assembly 12. A gimbling dimple 40 (shown in FIG. 4) to the slider 30 is attached to an arm 22. Head wires 23 are routed on top of the suspension assembly 12. The head wires 23 are contained within the height of the bent flanges 44 (shown in FIG. 4) running along each edge of the load beam 21 for wire protection and z-height control. Two head wires 23 are connected to the read head (not shown) on the slider 30 and two head wires 23 are connected to the write head on the slider 30.

FIG. 2 shows an optional load/unload feature 24 which is a lever used to load the slider 30 onto the disk 14 when the disk drive 10 is operational and to lift the slider 30 away from the disk 14 when the disk drive 10 is shut down. Removing the slider 30 away from the disk when not in use protects the disk 14 from being damaged by the slider 30 due to shock loading.

Figure 3:
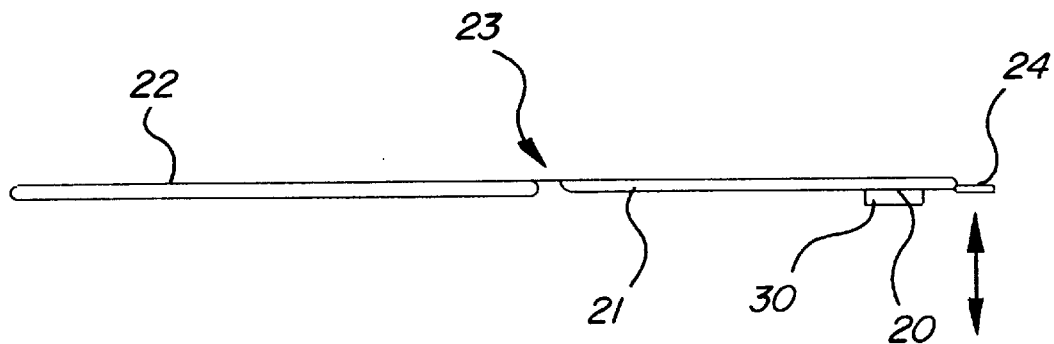
FIG. 3 is a side view diagram of an automatable wiring suspension assembly showing the slider.

FIG. 3 is a side view diagram of the suspension assembly 12. FIG. 3 shows the arm 22, the load beam 21, the flexure 20, and the head wires 23. Also shown is the slider 30 and the load/unload feature 24.

Figure 4:
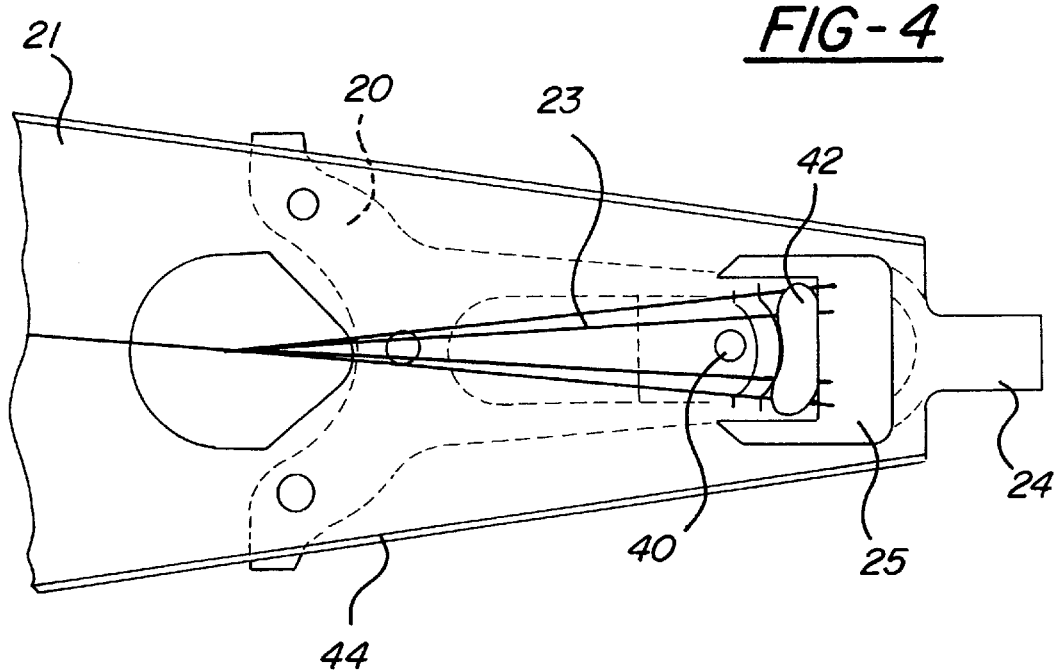
FIG. 4 is an expanded top view diagram of the head end of a suspension assembly showing a slider coated in accordance with the present invention.

FIG. 4 is an expanded view of the head end of FIG. 2. FIG. 4 shows the load beam 21 with the head wires 23 running across the top. The flexure 20 is underneath the load beam 21 and is therefore shown by dashed lines. A gimbling dimple 40 to the slider 30 is welded to the load beam 21. The function of the gimbling dimple 40 is to allow the slider 30 to rotate freely in the x-, y-, and z- direction as it moves across the disk 14. A large glue dot 42 is shown. The glue dot 42 is used to relieve the stress and tension on the head wires. Also shown is the wiring window 25 which permits automated wiring and termination of the head wires 23 on the suspension assembly 12 shown. Finally, at the end of the load beam 21 is the load/unload feature 24. The bent flanges 44 serve to stiffen the suspension load beam 21 to increase the natural frequencies.

Figure 5:
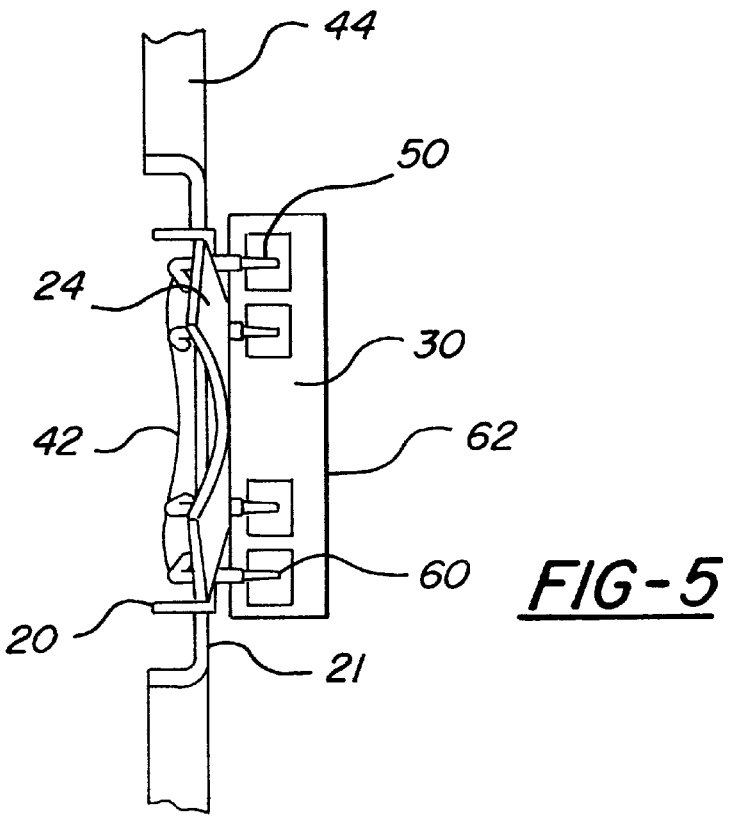
FIG. 5 is a front view diagram of the head end of a wiring suspension assembly.

FIG. 5 is a front view diagram of the head end of the suspension assembly 12. FIG. 5 shows the bent flanges 44 running along the edges of the load beam 21. Also shown is the glue dot 42 that relieves the stress and tension on the head wires 23. FIG. 5 shows in detail the termination point 50 of the head wires 23 as they bend down through the wiring window 25 (not labeled on this diagram) at the end of the flexure 20 and are attached to the wire termination pads 60 at the edge of the slider 30.

Figure 6:
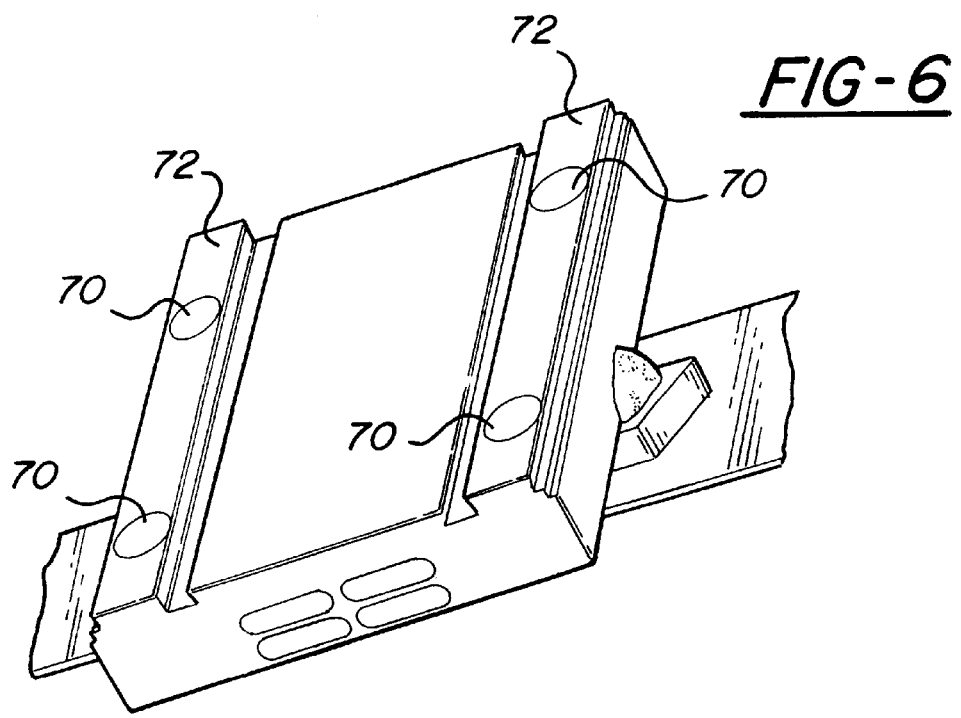
FIG. 6 is a diagram of a test structure used to evaluate various materials for wear resistance.

To test the wear rate of the invented coating, the bi-layer NiCrOx/carbon film 62 was deposited directly onto the air-bearing-surface of a test slider structure 30. As shown on the test structure diagram in FIG. 6, the carbon film was then patterned into four pads 70 on the slider rails 72 using photoresist masks and reactive-ion-etch (RIE) by oxygen plasma. The resultant air-bearing surface of the test slider structure 30 is shown in FIG. 6.

To compare the wear rate of various material, we prepared similar contact pads using sputtered $Al_2O_3$, SiOx and NiCrOx. In the case of $Al_2O_3$ and NiCrOx, a lift-off technique was used instead of the subtract-etch using reactive-ion-etch (RIE) technique.

The deposition of various films in this experiment was accomplished by radio frequency diode sputtering. The deposition conditions are summarized in Table I below.

| | Sputter gas | Pressure (mTorr) | Power (W) | Rate (nm/min) |
| --- | --- | --- | --- | --- |
| Carbon | Ar | 20 | 800 | 20 |
| H: Carbon | Ar + 4% $H_2$ | 20 | 800 | 12 |
| Alumina | Ar | 20 | 800 | 4 |
| SiOx | Ar | 20 | 800 | 23 |
| NiCrOx | Ar | 20 | 800 | 10 |

In the case of hydrogenated carbon, 4.0% $H_2$ was incorporated in the argon plasma during the deposition. The resultant carbon film contains a considerable amount of hydrogen, which was evidenced by the electrical resistivity and mechanical hardness measurements as shown in Table II below.

|  | Stress (MPa) | Hardness (GPa) | Resistivity (Ohm-Cm) | Thickness (μm) |
|---|---|---|---|---|
| Carbon | −82 | 10 | 0 | 2 |
| H: Carbon | −18 | 17 | NM | 2 |
| Alumina | 30 | 10 | NM | 2 |
| SiOx | −87 | 11 | NM | 2 |
| NiCrOx | 140 | 15 | 1000 | 2 |

The incorporation of hydrogen in the film reduces the deposition rate of carbon under otherwise identical deposition condition. (See Table I)

It is also noted that the 1000 angstrom NiCrOx adhesion layer is essential to obtain a good carbon film with two micrometers in thickness. Without the NiCrOx underlayer, we found that the carbon film suffers adhesion loss when its thickness exceeds 1000 angstroms.

For single layer $Al_2O_3$, SiOx and NiCrOx, similar deposition conditions were used to obtain 2.0 micrometer contact pads on the air-bearing surfaces of the sliders. The physical properties of these films are also summarized in Table II above.

A contact wear test of each coating of film was performed using the slider-on disk instrument made by Pro-Quip model SS3000. The load was adjusted to be 17 grams and the rotation speed was set at 300 revolutions per minute. The speed was chosen to ensure contact during the test. Standard 3380 sliders and lubricated and textured 5.25 inch thin film disks were used in this experiment. The test was interrupted, for the first few hours, to measure the wear rate on the pads, and was immediately terminated if wear tracks developed on the disk. Table III (below) summarizes the results of all the materials tested.

|  | Load (g) | RPM | Test Time (h) | Wear Rate | Disk Failure |
|---|---|---|---|---|---|
| Carbon | 17 | 300 | 120 | NM | No |
| H: Carbon | 17 | 300 | 120 | NM | No |
| Alumina | 17 | 300 | 0 | 500 nm/h | No |
| SiOx | 17 | 300 | 2 | 50 nm/h | Yes |
| NiCrOx | 17 | 300 | 0 | NM | Yes |

It is clear that both hydrogenated and non-hydrogenated carbon did not show any measurable wear after prolonged tests. The $Al_2O_3$ showed the most severe wear at 0.5 micrometer/hour wear rate. The SiOx pads show 0.05 micrometer/hour wear rate but wear tracks on the disk were developed at the end of the test. For NiCrOx pads, no wear could be measured on the pads, but the wear tracks on the disk occurred only after a few thousand cycles of revolution.

These experiments clearly demonstrate that the carbon and carbonaceous films are indeed the best choice for contact wear pads. Even though no obvious difference between hydrogenated and non-hydrogenated carbon pads were found, we believe that the hydrogenated carbon provides better wear resistance due to its higher mechanical hardness as shown in Table II above.

The NiCrOx/carbon bi-layer coating may be used as a protective coating at any head/disk interface, including the traditional disk drive system depicted in FIGS. 1 through 5. However, the invention may also be used as a protective coating on the wear pad of a head carrier in a contact recording system. This alternative embodiment is depicted in FIGS. 7 though 10.

Figure 7:
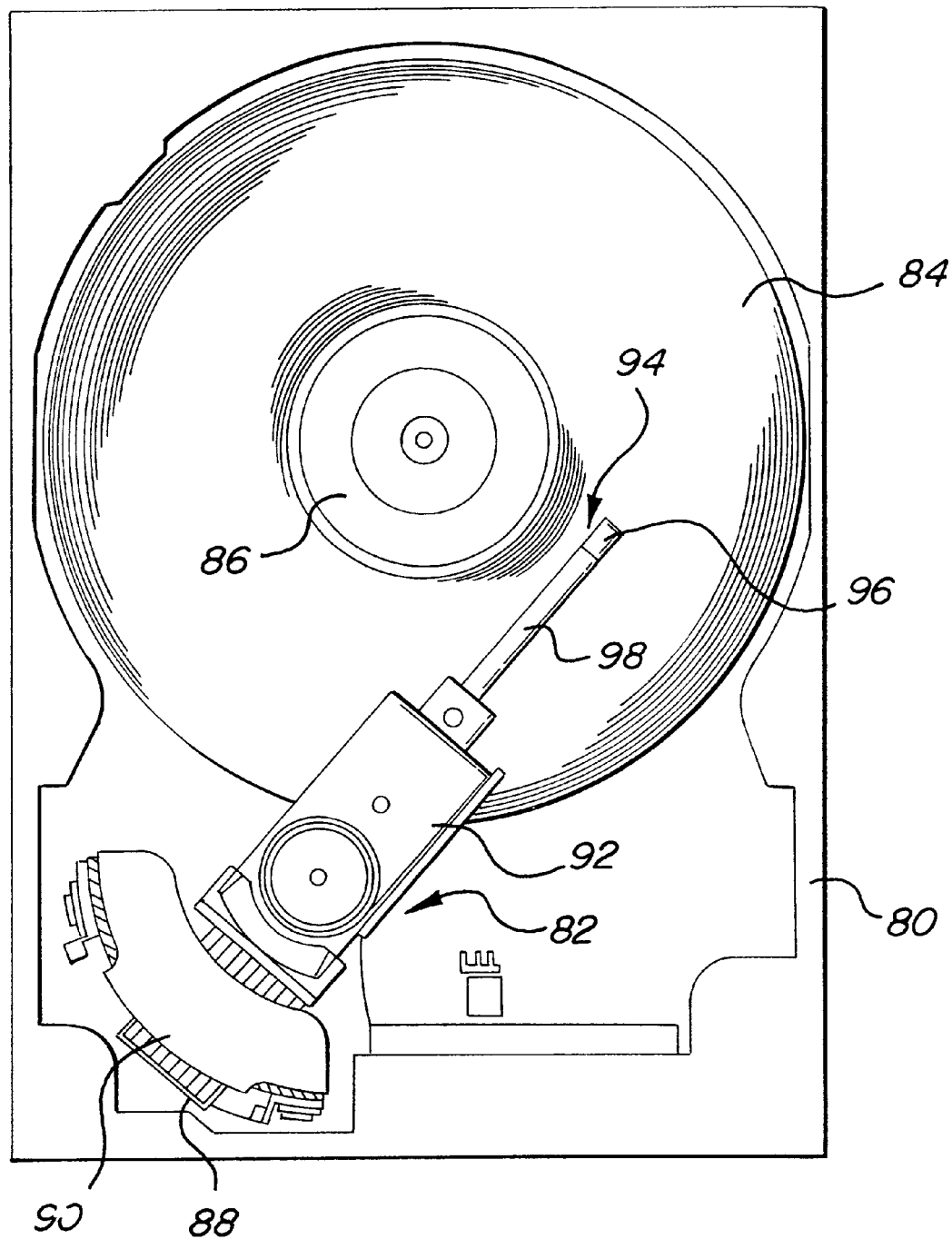
FIG. 7 is a top view diagram of a contact recording disk drive system utilizing a REED head structure.

FIG. 7 is a top view of a contact recording disk drive system including a housing 80 in which is mounted a rotary actuator 82, and an associated magnetic storage disk 84 mounted on a spindle 86, which is rotated by a drive motor (not shown) mounted to housing 80. The rotary actuator 82 moves the head-suspension assembly in an arcuate path across the disk 84. The rotary actuator 82 includes a voice coil motor (VCM), which comprises a coil 88 movable within the magnetic field of a fixed permanent magnet assembly having a core 90. An actuator arm 92 is attached to the movable coil 88. The other end of the actuator arm 92 is attached to a combination head-suspension assembly 94. The single-piece head-suspension assembly 94 includes a head-carrier segment 96 and a suspension section 98. Although head-suspension assembly 94 is depicted as a unitary body, it may also be of a two-piece construction where the carrier segment 96 is joined to the suspension section 98.

The suspension section 98 can support the head-carrier segment 96 in contact with the surface of disk 84. The suspension section 98 of the head-suspension assembly 96 provides a load to the head-carrier segment 96 which is generally perpendicular to the surface of the disk 84. This perpendicular load maintains the head-carrier segment 96 in contact with the data surface of the disk 84 during rotation of the disk 84.

Referring now to FIG. 8, the head-suspension assembly 94, which includes suspension section 98 and head-carrier segment 96, is shown in an enlarged section view and in contact with the surface of the magnetic recording disk 84. The head carrier 96 of the head-suspension assembly 94 has on the end facing the disk 84 a wear pad 100. As illustrated in the sectional view, the head carrier 96 has embedded within it an inductive read-write head which includes a pole piece (made up of pole tips 102, 104), a yoke 106, and a horizontally-oriented coil 108. The pole piece comprises adjacent pole tips 102, 104 which are spaced apart to define a magnetic recording gap 110. In the embodiment depicted in FIG. 8, the head carrier 96 is formed as a single piece and is integrated with the suspension 98. However, it is possible that the head carrier 96 can be fabricated as a separate segment, referred to as a "chiplet," and attached to a separate suspension. Also, while in the embodiment depicted in FIG. 8 the pole piece is part of an inductive read/write head, the head carrier 96 with wear pad 100 is also usable with other types of magnetic recording heads, such as heads wherein the pole pieces are vertical recording probes, magnetoresistive (MR) sensors with their associated shields, or magnetic flux guides for directing the magnetic flux from the disk to the MR sensor.

FIG. 9 is an illustration of the end of the wear pad 100 which faces the disk 84. The end of the wear pad 100 has a wear surface 112 which is essentially coplanar with the ends of pole tips 102, 104. During operation of the disk drive system, the wear pad 100, in particular the wear surface 112, is maintained in contact with the surface of the disk 84 and partially wears away over the lifetime of the disk drive system.

Referring now to FIG. 10, the head-carrier assembly 96 is shown in an enlarged view. As shown, the wear surface 100 is in contact with the disk 84. In accordance with the present invention, the wear pad 100 is comprised of two layers: a nickel chromium oxide adhesion promoter layer 114 and a carbon containing layer 116. Thus, this NiCrOx/carbon bi-layer coating provides protection for the read and write heads within the head carrier.

Although the present invention and its advantages have been described in detail, it should be understood that various changes, substitutions and alterations can be made herein without departing from the spirit or scope of the invention as defined in the appended claims.

What is claimed is:

1. A coating, for use on a head/disk interface of a disk drive system, comprising:
   a cermet layer, comprising a ceramic and a metal; the metal of said cermet layer comprising at least 5% by weight and not more than 70% by weight of said cermet; and
   a film, selected from the group consisting of carbon and carbonaceous material.

2. A coating-for use on a head/disk interface of a disk drive system, comprisinq:
   a cermet layer, comprising a ceramic and a metal, the metal of said cermet is selected from the group consisting of nickel-chromium, chromium, tungsten, tantalum, titanium, and molybdenum; and
   a film, selected from the group consisting of carbon and carbonaceous material.

3. A coating for use on a head/disk interface of a disk drive system, comprising:
   a cermet layer, comprising a ceramic and a metal, the ceramic of said cermet is selected from the group consisting of chromium oxide, silicon dioxide, and alumina; and
   a film, selected from the group consisting of carbon and carbonaceous material.

4. A coating in accordance with claim 1, wherein said ceramic is chromium oxide and said metal is nickel-chromium, with the nickel-chromium being at least 5% by weight and not more than 50% by weight of said cermet.

5. A coating in accordance with claim 1, wherein said ceramic is silicon dioxide and said metal is chromium, with the chromium being greater than or equal to 30% by weight and less than or equal to 70% by weight of said cermet.

6. A coating in accordance with claim 1, wherein said carbonaceous material comprising:
   carbon; and
   one or more elements selected from the group consisting of hydrogen, fluorine, nitrogen, boron, and silicon dioxide.

7. A slider, for use with a magnetic disk, comprising one or more contact pads which remain in contact with a magnetic disk during all or part of the time the magnetic disk is rotating, and wherein each contact pad comprises:
   a cermet layer, comprising a ceramic and a metal, the metal comprising at least 5% by weight and not more than 70% by weight of said cermet; and
   a film, selected from the group consisting of carbon and carbonaceous material.

8. A slider in accordance with claim 7, wherein the metal of said cermet is selected from the group consisting of nickel-chromium, chromium, tungsten, tantalum, titanium, and molybdenum.

9. A slider in accordance with claim 7, wherein the ceramic of said cermet is selected from the group consisting of chromium oxide, silicon dioxide, and alumina.

10. A slider in accordance with claim 7 wherein said ceramic is chromium oxide and said metal is nickel-chromium, with the nickel-chromium being at least 5% by weight and not more than 50% by weight of said cermet.

11. A slider in accordance with claim 7 wherein said ceramic is silicon dioxide and said metal is chromium, with the chromium being at least 30% by weight and not more than 70% by weight of said cermet.

12. A slider in accordance with claim 7, wherein said carbonaceous material comprising:
    carbon; and
    one or more elements selected from the group consisting of hydrogen, fluorine, nitrogen, boron, and silicon dioxide.

13. A suspension assembly comprising:
    a suspension section;
    a carrier having one or more wear pads, each wear pad comprising:
        a cermet layer, comprising a ceramic and a metal, the metal of said cermet layer comprising at least 5% by weight and not more than 70% by weight of said cermet; and
        a film, selected from the group consisting of carbon and carbonaceous material; and
    a head supported within the carrier for reading or writing data on the disk.

14. A suspension assembly in accordance with claim 13, wherein the metal of said cermet is selected from the group consisting of nickel-chromium, chromium, tungsten, tantalum, titanium, and molybdenum.

15. A suspension assembly in accordance with claim 13, wherein the ceramic of said cermet is selected from the group consisting of chromium oxide, silicon dioxide, and alumina.

16. A suspension assembly in accordance with claim 13, wherein said ceramic is chromium oxide and said metal is nickel-chromium, with the nickel-chromium being at least 5% by weight and not more than 50% by weight of said cermet.

17. A suspension assembly in accordance with claim 13, wherein said ceramic is silicon dioxide and said metal is chromium, with the chromium being at least 30% by weight and not more than 70% by weight of said cermet.

18. A suspension assembly in accordance with claim 13, wherein said carbonaceous material comprising:
    carbon; and
    one or more elements selected from the group consisting of hydrogen, fluorine, nitrogen, boron, and silicon dioxide.

19. A magnetic storage system comprising:
    a magnetic storage medium;
    a suspension assembly;
    means for moving said magnetic storage medium relative to said suspension assembly; and
    a slider attached to said suspension assembly, said slider including one or more contact pads which are subject to contact with said magnetic storage medium when said storage medium is moving, each contact pad comprising:
        a cermet layer, comprising a ceramic and a metal, the metal of said cermet layer comprising at least 5% by weight and not more than 50% by weight of said cermet; and
        a film, selected from the group consisting of carbon and carbonaceous material.

20. A magnetic storage system in accordance with claim 19, wherein the metal of said cermet is selected from the group consisting of nickel-chromium, chromium, tungsten, tantalum, titanium, and molybdenum.

21. A magnetic storage system in accordance with claim 19, wherein the ceramic of said cermet is selected from the group consisting of chromium oxide, silicon dioxide, and alumina.

22. A magnetic storage system in accordance with claim 19, wherein said ceramic is chromium oxide and said metal is nickel-chromium, with the nickel-chromium being at least 5% by weight and not more than 50% by weight of the cermet.

23. A magnetic storage system in accordance with claim 19, wherein said ceramic is silicon dioxide and said metal is chromium, with the chromium at least 30% by weight and not more than 70% by weight of said cermet.

24. A magnetic storage system in accordance with claim 19, wherein said carbonaceous material comprising:

carbon; and one or more elements selected from the group consisting of hydrogen, fluorine, nitrogen, boron, and silicon dioxide.

* * * * *